United States Patent [19]

Oshima et al.

[11] Patent Number: 5,060,841
[45] Date of Patent: Oct. 29, 1991

[54] WIRE BONDING METHOD AND APPARATUS AND METHOD OF PRODUCING SEMICONDUCTOR DEVICE BY USE OF WIRE BONDING APPARATUS

[75] Inventors: Yoshio Oshima, Tokorozawa; Yasushi Ishii, Kodaira; Hideki Hidaka, Hino; Kunihiro Tsuchiya, Choufu, all of Japan

[73] Assignees: Hitachi, Ltd., Tokyo; Hitachi Tokyo Electronics Co., Ltd., Ohme, both of Japan

[21] Appl. No.: 593,346

[22] Filed: Oct. 2, 1990

Related U.S. Application Data

[63] Continuation of Ser. No. 352,030, May 15, 1989, abandoned, which is a continuation of Ser. No. 946,773, Dec. 29, 1986, abandoned.

[30] Foreign Application Priority Data

Dec. 29, 1985 [JP] Japan .................. 60-290678

[51] Int. Cl.$^5$ ................. H05K 3/32; H01L 21/60
[52] U.S. Cl. ........................ 228/102; 228/179; 228/4.5; 228/9
[58] Field of Search ............ 228/102, 103, 110, 111, 228/179, 1.1, 4.5, 8, 9, 904

[56] References Cited

U.S. PATENT DOCUMENTS

| | | | |
|---|---|---|---|
| 4,444,349 | 4/1984 | Bilane et al. | 228/102 |
| 4,597,522 | 7/1986 | Kobayashi | 228/4.5 |
| 4,603,802 | 8/1986 | Kurtz et al. | 228/1.1 |
| 4,653,681 | 3/1987 | Dreibelbis et al. | 228/4.5 |
| 4,759,073 | 7/1988 | Shah et al. | 228/4.5 |

FOREIGN PATENT DOCUMENTS

| | | | |
|---|---|---|---|
| 124240 | 9/1980 | Japan | 228/4.5 |
| 188831 | 11/1982 | Japan | 228/1.1 |
| 31547 | 2/1983 | Japan | 228/4.5 |
| 54645 | 3/1983 | Japan | 228/4.5 |
| 103148 | 6/1983 | Japan | 228/4.5 |
| 184734 | 10/1983 | Japan | 228/4.5 |
| 199535 | 11/1983 | Japan | 228/1.1 |
| 84534 | 5/1984 | Japan | 228/1.1 |
| 88841 | 5/1984 | Japan | 228/1.1 |
| 130433 | 7/1984 | Japan | 228/4.5 |
| 74447 | 4/1985 | Japan | 228/1.1 |
| 102753 | 6/1985 | Japan | 228/1.1 |
| 132333 | 7/1985 | Japan | 228/1.1 |
| 138930 | 7/1985 | Japan | 228/1.1 |
| 193350 | 10/1985 | Japan | 228/4.5 |

Primary Examiner—Sam Heinrich
Attorney, Agent, or Firm—Antonelli, Terry, Stout & Kraus

[57] ABSTRACT

A wire bonding method and apparatus comprising a comparator wherein a difference between a position command signal for displacing a moving member such as, for example, a wire bonding tool, and a position signal obtained from a sensor for detecting the position of the moving member is compared with a predetermined threshold or reference value so that a stopping of the moving member, caused by an external force such as a contact therewith with another member can be rapidly and accurately electrically detected. A wire bonding method and apparatus is useable for producing a semiconductor device.

12 Claims, 2 Drawing Sheets

WIRE BONDING METHOD AND APPARATUS AND METHOD OF PRODUCING SEMICONDUCTOR DEVICE BY USE OF WIRE BONDING APPARATUS

This application is a continuation of application Ser. No. 352,030, filed May 15, 1989 which is a continuation of application Ser. No. 946,773 filed Dec. 29, 1986, both now abandoned.

BACKGROUND OF THE INVENTION

The present invention relates to a method and apparatus for wire bonding which includes a position detecting operation as well as a method for producing a semiconductor device by using the wire bonding apparatus.

In an assembly of a semiconductor device, when a pellet, set on a tab of a lead frame, is electrically connected to a lead in the lead frame through a bonding wire by a bonding tool to connect the bonding wire to a bonding pad of the pellet or the lead frame, it is important to accurately grasp the landing or contact position of the bonding tool at the bonding pad or the lead frame and to exactly halt the downward motion of the tool so as to provide an adequate bonding load as well as to prevent a collision as a result of the bonding tool being moved downwardly to the bonding pad or lead frame against the pellet or lead frame with a significant mechanical impact or impulse.

For example, it is possible to provide for detecting a landing or contact of the bonding tool by sensing a positional displacement of a bonding arm to which the bonding tool is secured through a mechanical contact of the like in response to a tool landing or contact since such bonding arm is rotatably attached to a rotary shaft mounted on a vertical movable block.

However, a disadvantage of such proposed construction resides in the fact that in a wire bonding apparatus for a landing or contacting of the wire bonding tool is detected through a mechanical contact, the response speed to the landing is relatively slow and, through repeated use of the contact, it is unavoidable that the contact is worn to consequently bring about a change with the passage of time in the open position of the contact. Thus, it becomes impossible to attain an exact detection of the landing or contact position of the bonding tool. Moreover, it has also been found that a so-called chattering phenomenon occurs in that the vertical movement of the bonding tool is unstable. Furthermore, the operation or service time of the apparatus is reduced due to the necessity of maintenance service including repair and replacement of worn contacts.

Additionally, a further disadvantage of the proposed apparatus employing mechanical contact resides in the fact that the unstable and inaccurate upward and downward motion of the bonding tool causes incomplete joining of the bonding wire to the bonding pad of the pellet and also to the lead frame or damage and/or breakage of the pellet induced by the bonding tool thereby considerably reducing the reliability of the wire bonding and that of the semiconductor device.

A wire bonding arrangement of the aforementioned type is disclosed in, for example, "Electronic Materials", Industrial Research Inc., Supplement Volume, Nov. 10, 1981, pp. 158–162.

SUMMARY OF THE INVENTION

The aim underlying the present invention essentially resides in providing a position detecting method and apparatus which enables a fast and accurate detection of a stopping of a moving member caused by a landing thereof.

In accordance with advantageous features of the present invention, a comparator is provided for comparing a difference between a position command signal for displacing a moving member and a position signal obtained from a position detecting sensor with a predetermined threshold or reference value. A landing or contacting of the moving member, which includes a stop or halting of the member caused by an external force is rapidly and accurately detected by the comparator without requiring a conventional mechanism such as a mechanical point in which a change is prone to be introduced with the passage of time.

DETAILED DESCRIPTION

Figure 1:
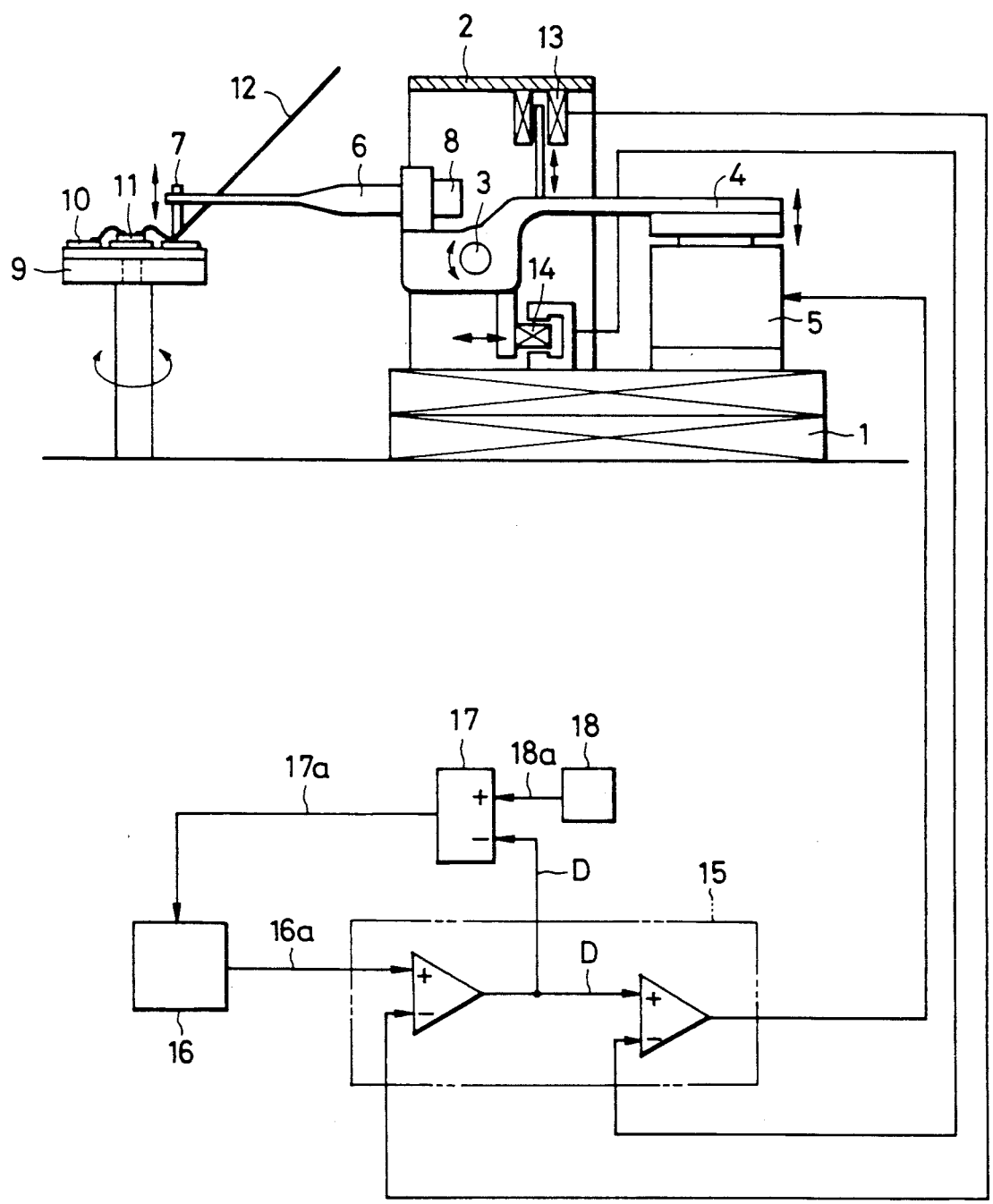
FIG. 1 is a partially schematic cross-sectional view of a wire bonding apparatus constructed in accordance with the present invention including a position detector for detecting a landing or contacting of a wire bonding tool.

Referring now to the drawings wherein like reference numerals are used throughout the various views to designate like parts and, more particularly, to FIG. 1, according to this figure, a wire bonding apparatus is provided which includes an X-Y table shiftable in a left, right, and vertical direction with respect to the plane of the paper, that is, in the X-direction and Y-direction on a horizontal plane, and a bonding head fixedly mounted on the X-Y Table 1. A bonding arm 4 is supported on the bonding head 2 through a horizontally mounted rotary shaft 3, with the bonding arm 4 being freely rotatable on the shaft 3 within a vertical plane.

A voice coil type linear motor 5, serving as an electric driving source for a bonding arm 4, is mechanically connected to one end, i.e., the right end in the drawing, of the bonding arm in such a manner so as to be displaceable in an upward and downward direction. When a vertical force is applied to the right end of the bonding arm 4, the bonding arm 4 is adequately swung around the rotary shaft or fulcrum 3.

A wedge 7 such as, for example, a bonding tool, is firmly attached to the other or left end of the bonding arm 4 through a ultrasonic horn 6 so that the wedge 7 is moved in an upward or downward direction in accordance with a swinging of the bonding arm 4. Ultrasonic vibrations imparted from an ultrasonic vibrator 8 through the horn 6 to the wedge 7 to ultrasonically vibrate the wedge 7.

By suitably combining the swinging of the bonding arm 4, that is, the upward and downward motion of the wedge 7, with a two directional shift of the X-Y table 1 in the horizontal plane, an electric connection is effected by a bonding wire 12 piercing or extending through the lower end of the wedge 7 between a lead frame or second region 10 mounted on a rotary table 9 for rotatably shifting a sample placed under the wedge 7, and a pellet or first region 11 anchored to the lead frame 10. The pellet 11 includes a semiconductor material such as, for example, silicon with a semiconductor element such as a transistor, IC or LSI.

The bonding head 2 is provided with a position detecting sensor 13 including, for example, a differential transformer and a speed detecting sensor 14 of, for example, a voice coil or the like, coupled to the bonding arm 4, wherein the actual position and speed in the upward and downward motion of the wedge 7, attached through the horn 6 to the bonding arm 4, are detected from the rotational position and speed of the bonding arm 4.

A position signal 13a and speed signal 14a of the wedge 7, respectively obtained from the position detecting sensor 13 and speed detecting sensor 14, are fed back to a motor driver or circuit 15 for driving the motor 5, while a position command signal 16a, transmitted from a controller 16 to the motor 15, is differentially amplified in sequence by the position signal 13a and speed signal 14a and is then inputted to the voice coil type linear motor 5, which is thereby controlled to perform an accurate control of a position and speed in the upward and downward motion of the wedge 7 displaced in accordance with the displacement of the coil type linear motor 5.

The position command signal 16a is an electric signal inputted through the motor driver or circuit 15 to the coil type linear motor 5. The right end of the bonding arm 4, connected to the voice coil type linear motor 5 is pivoted or swung on the rotary shaft or fulcrum 3 in accordance with the upward and downward motion of the displacement of the shaft of the voice coil type linear motor 5. Consequently, the wedge 7 is moved in an upward and downward direction in accordance with the swing or pivoting motion of the bonding arm 4 through the horn 6 connected to the left end of the bonding arm 4. Thus, the position command signal 16a determines the positional displacement and speed in the upward and downward motion of the wedge 7. Accordingly, a position command signal 16a includes both a positional displacement data component relative to the upward and downward motion of the wedge 7 and also an upward and downward speed component of the positional displacement. Thus, the upward and downward motion of the wedge 7 can be controlled by adjusting the positional displacement and speed of the wedge 7, that is, the shifting speed of the wedge 7 from one position to another.

A comparator 17 is connected to the motor driver 15 so that a differential signal D, representing a difference between the position command signal 16a and the position signal 13a inputted to the motor driver 15, is compared with a threshold or reference signal 18a present in a threshold or reference value holder 18, whereby the landing position of the wedge 7 to the lead frame or second bonding region 10 and the pellet or first bonding region 11 is electrically detected to produce a landing or contact signal 17a which is then fed to the controller 16.

The operation of the above described wire bonding apparatus of the present invention and process or method for manufacturing of a semiconductor device is described more fully hereinbelow.

Figure 2A:
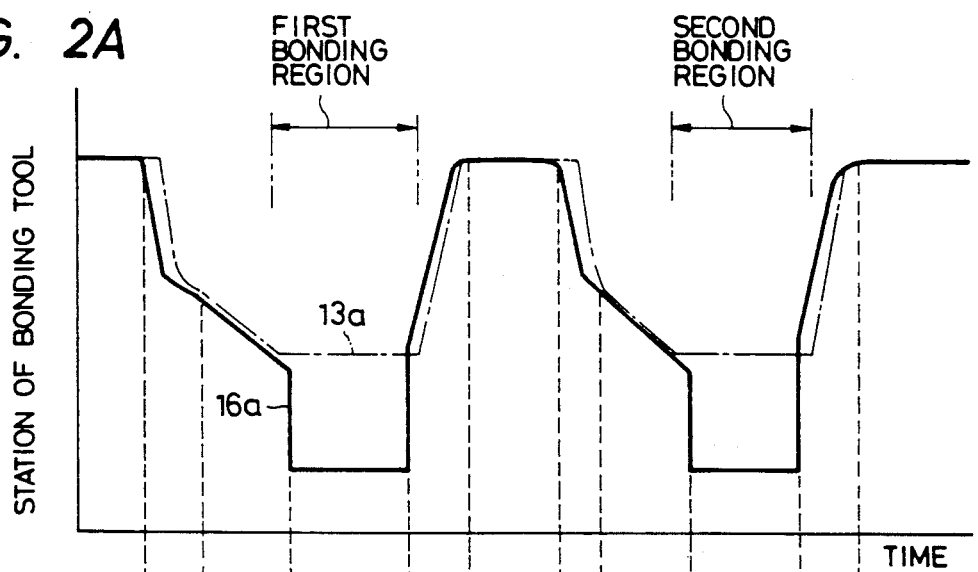
FIG. 2A is a graphical illustration of a comparison between a position command signal relative to a bonding tool and a position signal representing an actual position of the bonding tool.

First an article to be wire-bonded is set on a rotary table 9 and then a position command signal 16a, in the form of an electrical signal such as shown in FIG. 2A for moving the wedge in an upward and downward direction, is fed from the controller 16 through the motor driver 15 to the voice coil type linear motor 5 which serves as a driving source so as to cause an upward and downward motion of the bonding arm 4. As a result, the right end of the bonding arm 4 is rotated in a counterclockwise direction by a predetermined angle so that the wedge 7, displaceable in accordance with the upward and downward motion of the arm 4, is lifted to a predetermined position while the X-Y Table 1 is driven. Consequently, the wedge 7 is positioned immediately above the bonding pad of the pellet or first bonding region 11 and anchored to the lead frame or second bonding region 10.

Subsequently, at the right end of the bonding arm 4 is rotated in a counterclockwise direction so that the wedge 7 is moved downwardly onto the pellet 11 while being accelerated in an initial stage of its downward motion to execute a fast wire bonding operation and being decelerated in the stage immediately before contacting the pellet 11 so as to execute a soft landing or contact on the pad.

FIG. 2A graphically depicts a comparison between the position command signal 16a in the above-mentioned step and the position signal 13a obtained from the position detecting sensor and representing the actual position of the wedge 7.

Figure 2B:
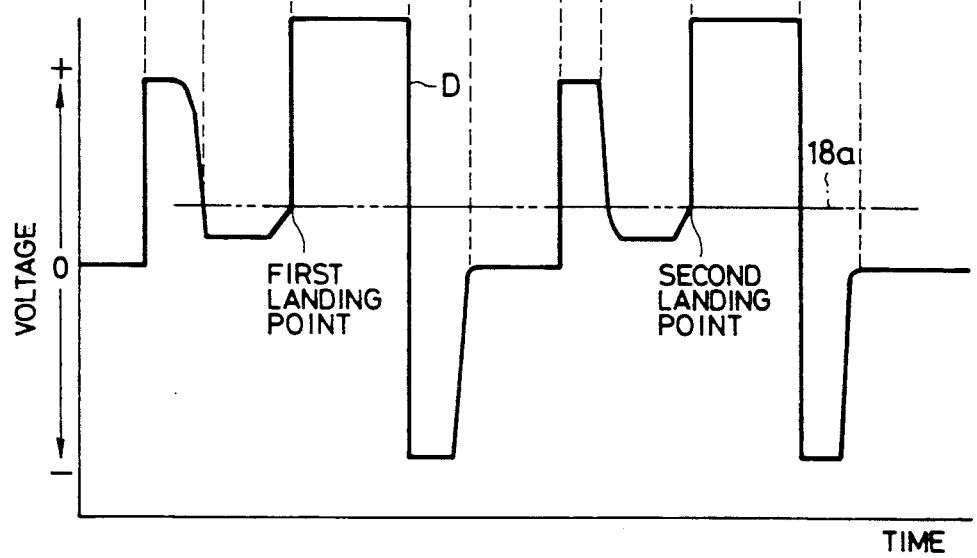
FIG. 2B is a graphical illustration of a differential signal attained as a difference between a position command signal and a position signal.

FIG. 2B graphically depicts the changes in the differential signal D which is obtained as the difference between the position command signal 16a and the position signal 13a. In the initial stage of the downward motion of the wedge 7, the actual displacement of the wedge 7 does not immediately follow the electric position command signal 16a due to inertia and other factors so that the differential signal D becomes positive. However, during the decelerated downward motion of the wedge 7, the actual displacement of the wedge 7 follows the position command signal 16a and, therefore, an approximate coincidence is attained between the value of the position command signal 16a and that of the actual displacement of the wedge 7 so that the differential signal D has a value of substantially zero.

When the wedge 7 is actually brought to a halt upon landing or contacting the bonding pad of the pellet 11 during its downward motion, only the value of the electric position command signal 16a decreases because further downward motion of the wedge 7 so that the differential signal D, corresponding to the difference between the position signal 13a and the position command signal 16a, increases. In this situation, the wedge 7 is no longer moved in a downward direction from the landing position on the bonding pad and is retained at the same position. When the differential signal D becomes equal to the threshold value 18a and the comparator 17, a landing signal 17a is transmitted therefrom to the controller 16, where the position command signal 16a is further increased to a predetermined value for a predetermined time in such a manner that the wedge 7 is pressed against the pellet 11 with a prescribed load, that is, an adequate wire bonding load is applied to the bonding wire 12. Then the front end of the bonding wire 12 piercing or extending through the lower end of the wedge 7 is pressed against the pellet 11 with the prescribed load while ultrasonic vibration is imparted from the ultrasonic vibrator 8 through the horn 6 to the wedge 7 whereby the front end of the bonding wire is forced to firmly adhere to the bonding pad of the pellet 11.

In the next stage of operation, the bonding arm 4 is rotated in a clockwise direction while the X-Y table 1 is shifted away from the rotary table 9 so that the wedge 7 is moved downwardly to the lead frame or second bonding region 10 along a prescribed locus while feeding the bonding wire 12 therethrough. As with the foregoing situation with respect to the pellet 11, the differential signal D is compared with the threshold or reference value 18a so that the landing position of the wedge 7 on the lead frame 10 is accurately detected. Then the lower lateral face of the bonding wire 12 piercing or extending through the lower end of the wedge 7 is pressed against the bonding region of the lead frame 10 while ultrasonic vibration is imparted through the horn 6 and through the wedge 7 to the bonding wire 12 a lower lateral face of which is thereby forced to adhere to the bonding region of the lead frame 11.

The bonding arm 4 is rotated in a clockwise direction with a forward feed of the bonding wire 12 being stopped or halted and the wedge 7 is moved upward while the X-Y table 1 is shifted away from the rotary table 9. In this stage of operation, the bonding wire 12 is gripped by a clamper means in a vicinity of the second bonding region or lead frame 10 and is cut when pulled by the clamping means. Subsequently, the rotary table 9 is rotated by a predetermined angle so as to be ready for the next wire bonding operation.

By repeating the above-described series of operations, an electrical connection is achieved between a plurality of leads in the lead frame 10 and a plurality of bonding pads of the pellet 11 anchored to a tab of the lead frame 10, whereby the article is completely wire bonded.

In accordance with the present invention, where the wedge is moved in an upward and downward direction with a rotation of the bonding arm 4, the landing positions of the wedge 7 to both the pellet 11 and the lead frame 10 can be obtained from a position detecting sensor 13 in the manner described hereinabove, and the differential signal D, corresponding to the difference between the position signal 13a, representing the detected actual position of the wedge 7 and the electric position command signal 16a for moving the wedge 7 in an upward and downward direction, is compared with a predetermined threshold or reference value 18a in the comparator 17 so that the landing position of the wedge 7 can be electrically detected. Accordingly, in comparison with previously proposed constructions where the landing position of the wedge 7 is detected by a mechanical contact, it is possible to avert the disadvantages such as instability induced in detecting the landing of the wedge 7 and reduction in the response speed. As a result, the upward and downward movement of the wedge 7 is controllable with sufficient rapidity and accuracy by utilizing the electric signal which corresponds to the landing of the wedge 7.

Consequently, it is possible to maintain an adequate bonding load in the pressing of the wedge 7 against the lead frame 10 or the pellet 11, and a collision of the lower end of the wedge 7 with the accompanying large mechanical impulse or impact against the lead frame 10 and the pellet 11 is avoided thereby ensuring a highly reliable wire bonding as well as an improved method of producing a semiconductor device without causing any damage or breakage at the wire bonding to the pellet 11 and the lead frame 10 so as to also achieve a highly reliable manufacturing of semiconductor devices.

Additionally, by virtue of the present invention, a landing of the wedge 7 can be electrically detected through the position detecting sensor 13, comparator 17 and associated elements without employing any mechanical means thereby eliminating the necessity of any maintenance and, consequently, the operation and efficiency of the wire bonding apparatus can be enhanced.

By virtue of the features of the present invention, the following advantages may be realized.

In accordance with the present invention a comparator is provided whereby the difference between a position command signal for controlling the displacement of a moving member and a position signal obtained from a sensor for detecting the actual position of the moving member is compared with a predetermined threshold or reference value so as to enable a detection of a stopping or halting of the moving member caused by an external force such as, for example, a landing or contact. Thus, it is possible to readily attain a fast and accurate detection of the halting or stopping of the moving member derived from any external force such as a contact or landing.

Moreover, by virtue of the provision of the comparator, the present invention is capable of avoiding, during a wire bonding operation for assembling a semiconductor device, instability in detecting a landing or contacting of a bonding tool and a reduction in the response speed differently from a conventional construction which mechanically detects a landing or contacting of the bonding tool through a mechanical contact or the like and, consequently, the upward and downward motion of the bonding tool is rapidly and accurately controllable. Furthermore, a bonding load applied by the pressing tool to the bonding region is maintained at a proper value and can be so adjusted so as to ensure a soft landing or contacting of the bonding tool at the bonding region and thus an undesired collision of the bonding tool against the bonding region due to a violent contact or landing can be prevented so as to achieve a highly rapid and highly reliable wire bonding operation.

Additionally, by virtue of the features of the present invention, it is possible to produce a satisfactory semiconductor device wire-bonded with a proper load and timing thereby significantly improving the manufacture of a semiconductor device with a high-reliable wire bonding.

Additionally, by virtue of the provision of the comparator in accordance with the present invention it is then necessary to provide for a maintenance service schedule for a mechanical mechanism for detecting a landing or contacting of the bonding tool and, therefore, the entire time period required for maintenance of the wire bonding apparatus is reduced so that the apparatus can be maintained in operation for a longer service time thereby enhancing the operational efficiency of the wire bonding apparatus.

As can be appreciated, by virtue of the above described features of the present invention, it is possible to provide a wire bonding apparatus and method which significantly improves the productivity in the assembling operation of semiconductor devices.

The wire bonding method and apparatus and process or method for producing a semiconductor as proposed by the present invention has been described as utilizing an ultrasonic wire bonding mode with a wedge as a bonding tool; however, similar technical effects can be attained by utilizing another wire bonding mode such as, for example, a capillary as a wire bonding tool. This mode is generally termed as a "ball-bonding" which is carried out by employing a capillary as a wire bonding tool. In accordance with the capillary wire bonding mode, first a bonding wire having a ball and a front end thereof is bonded to a bonding pad or first bonding region in a pellet and then the wire is bonded to an external lead or second bonding region corresponding to the pad.

The wire bonding concept utilizing a capillary as a bonding tool is classified as a thermo-compression system utilizing heat and pressure to bond a wire with a capillary to a de si red article and a combination of such thermo-compression system and ultrasonic system which executes wire bonding while applying ultrasonic vibration to the capillary. Advantageously, the bonding wire may be composed of a thin metallic wire of a suitable material such as, for example, gold (Au) aluminum (Al) or copper (Cu).

While the above description relates to a wire bonding technique, it is to be understood that the invention is not limited to such application and, for example, the principles of the present invention are applicable to, for example, a position detection which requires high precision and a control displacement of the like of a moving member.

While we have shown and described only one embodiment in accordance with the present invention, it is understood that the same is not limited thereto but is susceptible to numerous changes and modifications as known to one of ordinary skill in the art, and we therefore do not wish to be limited to the details shown and described herein, but intend to cover all such modifications as are encompassed by the scope of the appended claims.

We claim:

1. A wire bonding method for electrically connecting a first wire bonding region to a second wire bonding region corresponding thereto through a bonding wire by a bonding tool means and a bonding arm means supporting the bonding tool means, the method comprising the steps of:
   directly driving the bonding tool means and bonding arm means in a wire bonding cycle for driving the tool in an upward and downward direction by one of a linear motor and an electromagnetic linear drive means during said wire bonding cycle;
   monitoring a differential signal during said wire bonding cycle representative of a difference between a position command signal for controlling an upward and downward displacement of the bonding tool means and a position signal outputted from a sensor for electrically detecting an actual upward and downward displacement of said bonding tool means; and
   actuating said bonding tool means in accordance with an increase in value of said differential signal monitored during said wire bonding cycle to a landing of the tool on one of the first and second bonding regions up to a predetermined threshold value, by applying a predetermined bonding load to the bonding tool means with one of the linear motor and the electromagnetic linear drive means to execute a wire bonding operation.

2. The method as defined in claim 1, wherein said bonding tool means includes a wedge means operating in an ultrasonic wire bonding mode.

3. The method as defined in claim 1, wherein said bonding tool means includes a capillary means operating in a ball bonding mode.

4. The method as defined in claim 1, wherein said bonding tool means includes a capillary means having both thermal compression and ultrasonic vibration applied thereto.

5. A wire bonding method for bonding a first wire bonding region to a second wire bonding region corresponding thereto through a bonding wire by a bonding tool means and a bonding arm means supporting the bonding tool means, the method comprising the steps of:
   directly driving the bonding tool means and the bonding arm means in a bonding cycle for driving the tool in an upward and downward direction by one of a linear motor means and an electromagnetic linear drive means;
   monitoring a differential signal during said wire bonding cycle representative of a difference between a position command signal for controlling an upward and downward displacement of the bonding tool means and a position signal outputted from a sensor means for electrically detecting an actual upward and downward displacement of said bonding tool means during said wire bonding cycle;
   actuating said differential signal with a predetermined threshold value for detecting a stopping of said bonding tool means caused by a landing of the bonding tool means on one of the first and second bonding regions so as to obtain a landing signal; and
   actuating said bonding tool means in accordance with the landing signal, by applying a predetermined bonding load to the bonding tool means with one of the linear motor means and the electromagnetic linear drive means to execute a wire bonding operation.

6. The method as defined in claim 5, wherein said bonding tool means includes a wedge means operating in an ultrasonic wire bonding mode.

7. The method as defined in claim 5, wherein said bonding tool means includes a capillary means in a ball bonding mode.

8. A wire bonding apparatus, the apparatus comprising:
   a bonding tool means;
   a driving arm means supporting said bonding tool means at one end thereof;
   a driving source means for driving said bonding arm means and said bonding tool means in a bonding cycle in an upward and downward direction by one of a linear motor and an electromagnetic linear drive means;
   an X-Y table for mounting and driving, in an X direction and a Y direction, said bonding tool means, said driving arm means, and said driving source means;
   a position detecting sensor means for detecting the upward and downward displacement of said arm means during said bonding cycle;
   a control circuit means for electrically controlling said driving source means during said bonding cycle; and comparator means for comparing a differential signal with a predetermined threshold value and detecting, in accordance with a result of a comparison by the comparator means during said bonding cycle, a stopping of said bonding tool means caused by a landing of said bonding tool means on a workpiece, said differential signal representing a difference between a position command signal for displacing said bonding tool means in the upward and downward directions through said control circuit means, driving source means and arm means, and a position signal obtained from said position detecting sensor means, during said wire bonding cycle said control circuit means being adapted to actuate said bonding tool means, in accordance with the detection of the landing, by applying a predetermined bonding load to the bonding tool means with the driving source means.

9. A wire bonding apparatus comprising:

a wedge means forming a bonding tool means in an ultrasonic wire bonding mode;

an ultrasonic horn means connected to said wedge means;

an ultrasonic vibrator means for ultrasonically vibrating said wedge means;

driving source means including one of a linear motor means and an electromagnetic linear drive means for displacing said wedge means in an upward and downward direction during a wire bonding cycle;

an arm means for supporting said bonding tool means at one end thereof;

an X-Y table for mounting and driving, in an X-direction and a Y-direction, the wedge means, the ultrasonic horn means, the ultrasonic vibrator means, the driving source means, and the arm means;

fulcrum means for mounting said arm means in such a fashion that said ultrasonic horn means is attached to an end thereof disposed opposite to an upward and downward displacement portion of said driving source means;

a position detecting sensor means for detecting an upward and downward displacement of said arm means during said wire bonding cycle;

a control circuit means for electrically controlling the upward and downward displacement portion of said driving source means during said wire bonding cycle; and a comparator means for comparing a differential signal with a predetermined threshold value and detecting, in accordance with a result of a comparison by the comparator means during said wire bonding cycle, a stopping of said bonding tool means caused by a landing of said bonding tool means on a workpiece, said differential signal representing a difference between a position command signal for displacing said bonding tool means upwardly and downwardly through said control circuit means, driving source means, and arm means, and a position signal obtained from said position detecting sensor means during said wire bonding cycle, said control circuit means being adapted to actuate said bonding tool means, in accordance with the detection of the landing, by initiating the ultrasonic vibrator means and applying a predetermined bonding load to the bonding tool means with the driving source means to execute a wire bonding operation.

10. A wire bonding apparatus comprising:

a capillary means for forming a wire bonding tool in a ball bonding mode;

a driving source means including one of a linear motor means and an electromagnetic linear drive means for moving said capillary means in an upward and downward direction during a wire bonding cycle;

arm means having said capillary means attached to one end thereof;

fulcrum means for mounting said arm means such that said capillary means and an upward and downward displacement portion of said driving source means is disposed at an end of said arm means opposite said capillary means;

a position detecting sensor means for detecting an upward and downward displacement of said arm means during said wire bonding cycle;

a control circuit means for electrically controlling the upward and downward displacement portion of said driving source means during said wire bonding cycle; and a comparator means for comparing a differential signal with a predetermined threshold value and detecting, in accordance with a result of a comparison by said comparator means during said wire bonding cycle, a stopping of said bonding tool means caused by a landing of the bonding tool means on a workpiece, said differential signal representing a difference between a position command signal for displacing said bonding tool means upwardly and downwardly through said control circuit means, driving source means, the arm means, and a position signal obtained from said position detecting sensor means during said wire bonding cycle, said control circuit means being adapted to actuate said bonding tool means, in accordance with the detection of the landing, by applying a predetermined bonding load to the bonding tool means with the driving source means.

11. An apparatus according to claim 10, wherein means are provided for applying a thermo-compression and ultrasonic vibration to said capillary means.

12. An apparatus according to claim 10, wherein means are provided for applying a thermo-compression to said capillary means.

* * * * *